United States Patent [19]
Fulford, Jr. et al.

[11] Patent Number: 5,943,550
[45] Date of Patent: Aug. 24, 1999

[54] METHOD OF PROCESSING A SEMICONDUCTOR WAFER FOR CONTROLLING DRIVE CURRENT

[75] Inventors: H. Jim Fulford, Jr.; Derick Wristers, both of Austin, Tex.

[73] Assignee: Advanced Micro Devices, Inc., Sunnyvale, Calif.

[21] Appl. No.: 08/623,802

[22] Filed: Mar. 29, 1996

[51] Int. Cl.$^6$ .................................................. H01L 21/66
[52] U.S. Cl. .............................. 438/14; 438/17; 438/308; 438/197; 148/DIG. 3; 148/DIG. 122; 148/DIG. 137
[58] Field of Search .................................. 438/14, 16, 17, 438/18, FOR 141, FOR 142, 719, 753, 378, 530, 550, 308, 197; 430/311; 148/DIG. 3, DIG. 122, DIG. 137

[56] References Cited

U.S. PATENT DOCUMENTS

| | | |
|---|---|---|
| 4,789,825 | 12/1988 | Carelli et al. ............................ 324/765 |
| 4,883,352 | 11/1989 | Bruning .................................. 353/122 |
| 4,984,902 | 1/1991 | Crowley et al. ......................... 374/126 |
| 5,365,340 | 11/1994 | Ledger .................................... 356/357 |
| 5,393,624 | 2/1995 | Ushijima .................................. 430/30 |
| 5,399,229 | 3/1995 | Stefani et al. .............................. 438/7 |
| 5,554,486 | 9/1996 | Garza ....................................... 427/58 |
| 5,618,461 | 4/1997 | Burke et al. ............................ 374/126 |
| 5,654,904 | 8/1997 | Thakyur .................................. 702/137 |
| 5,763,124 | 6/1998 | Koizumi et al. .......................... 430/30 |
| 5,848,842 | 12/1998 | Peuse et al. ................................ 374/1 |

FOREIGN PATENT DOCUMENTS

| | | |
|---|---|---|
| 0 631 304 | 12/1994 | European Pat. Off. . |
| 58-122726 | 7/1983 | Japan . |
| 2-010821 | 1/1990 | Japan . |
| 2-10821 | 1/1990 | Japan . |
| WO95/31003 | 11/1995 | WIPO . |

*Primary Examiner*—Michael Trinh
*Attorney, Agent, or Firm*—Skjerven, Morrill, MacPherson, Franklin & Friel LLP; Ken J. Koestner

[57] ABSTRACT

Transistor drive current is controlled by controllably varying light exposure across a semiconductor substrate wafer based on an integrated circuit parameter. Integrated circuit parameters upon which the light exposure is varied include gate oxide thickness, rapid temperature annealing (RTA) temperature, polyetch bias and the like.

20 Claims, 14 Drawing Sheets

METHOD OF PROCESSING A SEMICONDUCTOR WAFER FOR CONTROLLING DRIVE CURRENT

BACKGROUND OF THE INVENTION

1. Field of the Invention

The present invention relates to a method of manufacturing integrated circuits on semiconductor substrates. More specifically, the present invention relates to a manufacturing method which improves control of transistor drive current by varying the exposure across the wafer based on integrated circuit parameters.

2. Description of the Related Art

In a lithographic process, photoresist is applied as a thin film to a substrate and subsequently exposed through a mask. The mask contains clear and opaque features that define a pattern to be created in the photoresist layer. Areas in the photoresist layer that are exposed to the light are made either soluble or insoluble in a specific solvent called a developer. Regions of silicon oxide that are not covered by photoresist following developing are removed by etching, replicating the mask pattern in the oxide layer. The photoresist has two functions, responding to the exposing radiation to replicate the mask image in the photoresist and protecting the underlying substrate in the remaining areas of photoresist during subsequent processing.

Performance of transistors that are fabricated in an integrated circuit strongly depends on the precision of structures formed using the lithographic process and the application of various physical parameters during processing. For example, variability of gate oxide thickness, polysilicon etch bias and rapid thermal annealing (RTA) temperature all lead to variations in drive current of a transistor. Drive current, the current from source to drain of a transistor, is indicative of the speed performance of a transistor. A uniform drive current in transistors across a semiconductor wafer results in a uniform speed of transistors across the wafer and a low leakage current even in conditions when the drive current is high. On the other hand, a drive current that is nonuniform across the wafer results in a high $I_{CC}$ standby current, a high leakage current and high power consumption by the integrated circuit. Traditionally, drive current uniformity is sought by reducing the variability in parameters, such as gate oxide thickness, polysilicon etch bias and rapid thermal annealing (RTA) temperature, that give rise to drive current variations. However, the reduction in variability of these parameters is difficult. What is needed is a method of promoting the uniformity of drive current beyond what is achieved by reducing the variability of parameters that give rise to drive current variations.

What is also needed is an integrated circuit with a tight distribution of drive current, in which the drive current across the entire wafer is highly uniform.

What is further needed is a method of reliably producing an integrated circuit in which the drive current across an entire semiconductor wafer is uniform.

SUMMARY OF THE INVENTION

In accordance with the present invention, transistor drive current is controlled by controllably varying light exposure across a semiconductor substrate wafer based on an integrated circuit parameter. Integrated circuit parameters upon which the light exposure is varied include gate oxide thickness, rapid temperature annealing (RTA) temperature, polyetch bias and the like.

In some embodiments of the present invention, a semiconductor wafer is partitioned into a plurality of areas and a photolithographic process is applied in which the exposure in each of the plurality of areas is individually and independently controlled.

In some embodiments of the present invention, a photolithographic process is applied in which the exposure is controlled to change the exposure intensity in a radial pattern so that the exposure is changed moving from the center towards the edge of a wafer.

In accordance with one embodiment of the present invention, a method of controlling a drive current spatial distribution on a semiconductor wafer during fabrication of an integrated circuit includes the steps of determining a spatial distribution on the semiconductor wafer of a parameter that effects the drive current, determining the effect of the parameter on the drive current and exposing the semiconductor wafer to illumination, variably within the spatial distribution on the semiconductor wafer so that the effect of the parameter is counteracted.

The described semiconductor processing method achieves numerous advantages. One advantage is that the current drive is made substantially constant across a semiconductor wafer. This advantage increases in importance as semiconductor technology advances and wafers become larger. As semiconductor wafers increase in size from 8 to 10 to 12 inch diameter wafers, the variability across the wafer in parameters such as gate oxide thickness, polysilicon etch bias and RTA temperature will also increase, resulting in larger variations in drive current.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE PREFERRED EMBODIMENTS

Figure 1:
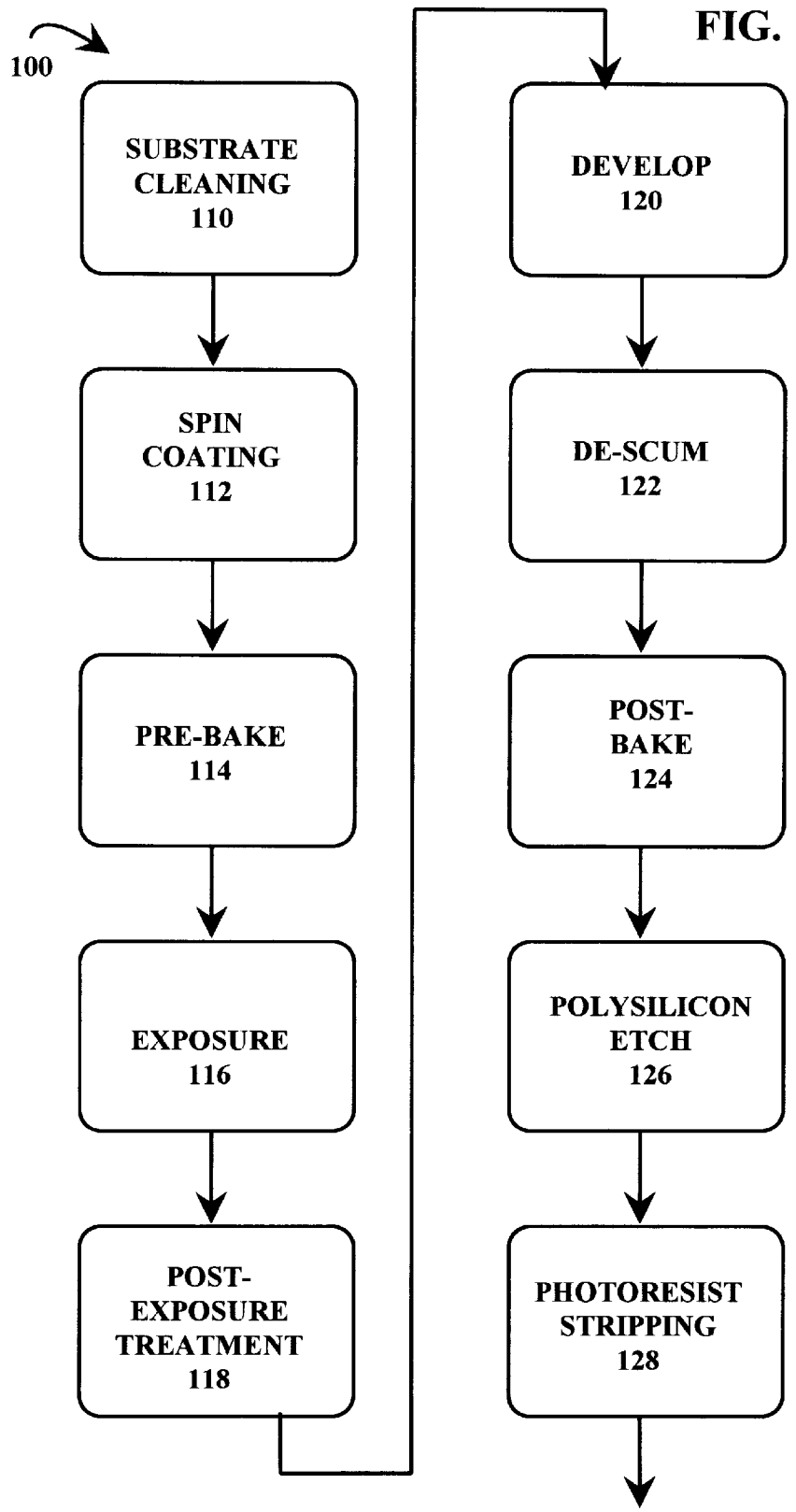
FIG. 1 is a flow chart which illustrates steps of a typical photoresist process.

Referring to FIG. 1, a flow chart of a typical photoresist process 100 is shown which includes an optional substrate cleaning step 110, a spin coating step 112, a pre-bake step 114, an exposure step 116, an optional post-exposure treatment step 118, a develop step 120, an optional de-scum step 122, a post-bake step 124, a polysilicon etch step 126 and a photoresist stripping step 128. The optional steps are not used for the processing of certain materials.

Many problems that arise in photoresist processing are attributed to a dirty or contaminated semiconductor wafer surface. The substrate cleaning step 110 is used to clean the wafer surface and thereby to avoid dirty substrate surfaces that adversely affect a lithographic process. Problems that arise from a dirty substrate surface include poor adhesion, defects such as pinholes and opaque spots, loss of line width control, or the entire loss of some pattern elements. The substrate cleaning step 110 is optional for most surfaces in VLSI fabrication since most surfaces are formed by either thermal oxidation or reduced pressure deposition techniques so that the surface is cleanest immediately following formation. If processing begins immediately upon surface formation, substrate cleaning step 110 is not necessary. In some cases, the substrate cleaning step 110 is combined with dehydration baking to remove moisture from the atmosphere that is rapidly absorbed by the substrate surface. Dehydration baking is carried out at atmospheric pressure and three temperature plateaus, 150–200° C. to remove surface water molecules, 400° C. to evolve loosely held water of hydration and about 750° C. for total dehydration. Also associated with the substrate cleaning step 110 is a priming step of applying primer with a preresist coating of a material designed to improve adhesion, such as hexamethyldisilazane (HMDS), typically by spin coating or vapor priming.

In spin coating step 112, substrate wafers are spin-coated with photoresist to produce a uniform, adherent, defect-free polymeric film of a desired thickness over the entire wafer. Photoresist is applied to a circular substrate wafer and the wafer is rapidly spun until the photoresist is essentially dry. Spin coating typically distributes the photoresist film with a uniformity across the wafer of approximately plus or minus 100 angstroms. The spin coating step 112 includes three stages, dispensing the resist solution onto the wafer, angularly accelerating the wafer quickly (for example, about 20,000 rpm/sec) to a final rotational speed, and spinning at a constant angular velocity (for example, 3000 to 7000 rpm for 20–30 seconds) to establish a desired thickness and to dry the photoresist film. Photoresist viscosity and film thickness depend on temperature so temperature is controlled to plus or minus 1° C. during spin coating with the substrate wafers, photoresist and spinner hardware maintained in thermal equilibrium.

Pre-bake step 114 is a soft-bake procedure in which photoresist-coated wafers are subjected to a predetermined temperature. The pre-bake step 114 is performed to remove solvent from the spun-on photoresist, improve adhesion of the photoresist and anneal stresses caused by the shear forces encountered in the spinning process. The degree of soft-baking depends on the temperature, time of baking and the baking equipment and determines the residual solvent content of the photoresist. The rate of attack of the photoresist by a developer is significantly dependent on the solvent concentration. In general, the more residual solvent, the higher the dissolution rate in developer so that wafers with insufficient soft-baking are attacked by the developer in both exposed and unexposed regions of the wafer. Soft-baking is closely linked to the exposure and development. Soft baking is typically performed in convection, infrared (IR) and hot-plate ovens. Soft baking attempts to produce uniform, controlled temperatures at a high cleanliness.

The exposure step 116 is performed after photoresist coating of the wafer and soft baking by exposing the wafer to some form of radiation to create a latent image in the resist. The degree of exposure is controlled by adjusting the amount of energy impinging on the photoresist. The exposure energy is the product of the intensity of the radiation source and the time of exposure. The exposure step 116 is an important step in photoresist processing for several reasons. First, exposure is a step in an imaging sequence in which the wafers are individually processed so that a lengthy exposure process may lead to a throughput restriction relative to other photoresist processing steps. Also, attempts to increase processing throughput during exposure typically results in decreased resolution. Longer exposure times and consequential slower throughput are typical of high resolution photoresists.

During the exposure step 116, photochemical transformations occur within the photoresist. The goal of an optimized exposure process is production of desired photochemical effects in the shortest amount of time while maintaining a high reproducibility. Optimization of the exposure step 116 is highly correlated with other steps of the photoresist process 100. In particular, the exposure step 116 optimization depends on determining an optimum resist thickness and producing this optimum thickness uniformly across the wafer and among the multiple wafers produced. The exposure step 116 also depends on choosing a soft-bake process that complements exposure conditions and determining line-width specifications and dimensional tolerances with respect to a mask and exposure tool. The exposure step 116 further depends on establishing the developer concentration, temperature, agitation requirements and selecting post-bake conditional based on other steps of the photoresist process 100. The photoresist process 116 further depends on the specification of a photoresist etching process.

Variations of photoresist thickness result in changes in the line width. For example, a variation of 20% in photoresist thickness may result in a line width variation of 0.25 $\mu$m, which may be tolerable in practice. However, typically other parameters, for example lamp intensity and developer concentration, that impact line width also have a variability. If all such parameters were to show worst-case variation, a larger cumulative line width would result so that a 20% variation in photoresist thickness is unacceptable as part of a set of allowable photoresist process variations.

Results of the exposure step 116 are made further variable by standing waves, which are caused when actinic light waves propagate through a photoresist film down to the substrate, reflect off the substrate back through the photoresist. The reflected waves constructively and destructively interfere with the incident waves so create zones of high and low exposure with a separation of $\lambda/4n$, where $\lambda$ is wavelength of the illumination and n is the index of refraction of the photoresist. Standing waves are disadvantageous because the periodic variation of light intensity in the photoresist causes the photoresist to receive nonuniform doses of energy throughout the layer thickness. Standing waves also disadvantageously cause line width variations as the photoresist crosses a step, due to variation of the total energy coupled to the photoresist by interference effects at different photoresist thickness. Both the periodic variation in light intensity and the line width variations contribute to resolution loss of photoresists.

Photoresist line width variations are most difficult to control in the vicinity of steps, where large photoresist thickness changes take place. These variations result from differences in the energy that is coupled into the photoresist at different photoresist thickness, scattering of light at steps due to diffraction and reflections, and standing wave effects.

One technique for reducing line width variations over steps involves usage of anti-reflective coatings (ARC) which absorbs most of the radiation that penetrates the photoresist. Standing wave effects are substantially reduced because much less radiation is available to reflect off the substrate. Scattering from topographical features is also suppressed. Also, ARC partially planarizes the wafer topography, further improving line width variation over steps. However, usage of ARC also has some disadvantages. In particular, two extra process steps are incurred through usage of ARCs: spin-coating of ARC before spinning on the photoresist and prebaking the ARC before spinning on the photoresist. The optional post-exposure treatment step 118 is incurred if ARC is used. The post-exposure treatment step 118 involves transferring the pattern to the ARC.

The develop step 120 develops the photoresist film to leave behind an image which subsequently serves as a mask for etching, ion-implantation, lift-off and the like. The development step 120 attempts to leave the original thickness of unexposed resist without measurable reduction while precisely producing specified patterned dimensions. Development should cause minimal pattern distortion or swelling and the development time should be short, a minute or less. Development is typically accomplished by immersion, spray or puddle developing. Immersion developing involves immersing a wafer into a developer bath and agitating the wafer for a specified time at a specified temperature. Spray developing involves spraying developer on rotating wafers, allowing a controlled fraction of the developer to drain off the wafers. The puddle technique is carried out by dispensing a fixed amount of developer onto a static wafer. The develop step 120 is typically optimized in terms of developer concentration, developer temperature and developer agitation method.

The optional de-scum step 122 is a mild plasma treatment that is typically used to remove very small quantities of photoresist in small unwanted areas, for example a few hundred angstrom areas. The de-scum step 122 is used to remove photoresist that could not be removed during the develop step 120.

During the post-bake step 124, the photoresist is subjected to an elevated temperature after development but before etching so that residual solvents are removed to improve adhesion and to increase the etch resistance of the photoresist.

Polysilicon is etched in etch step 126 and the photoresist is removed in the photoresist stripping step 128.

Figure 2:
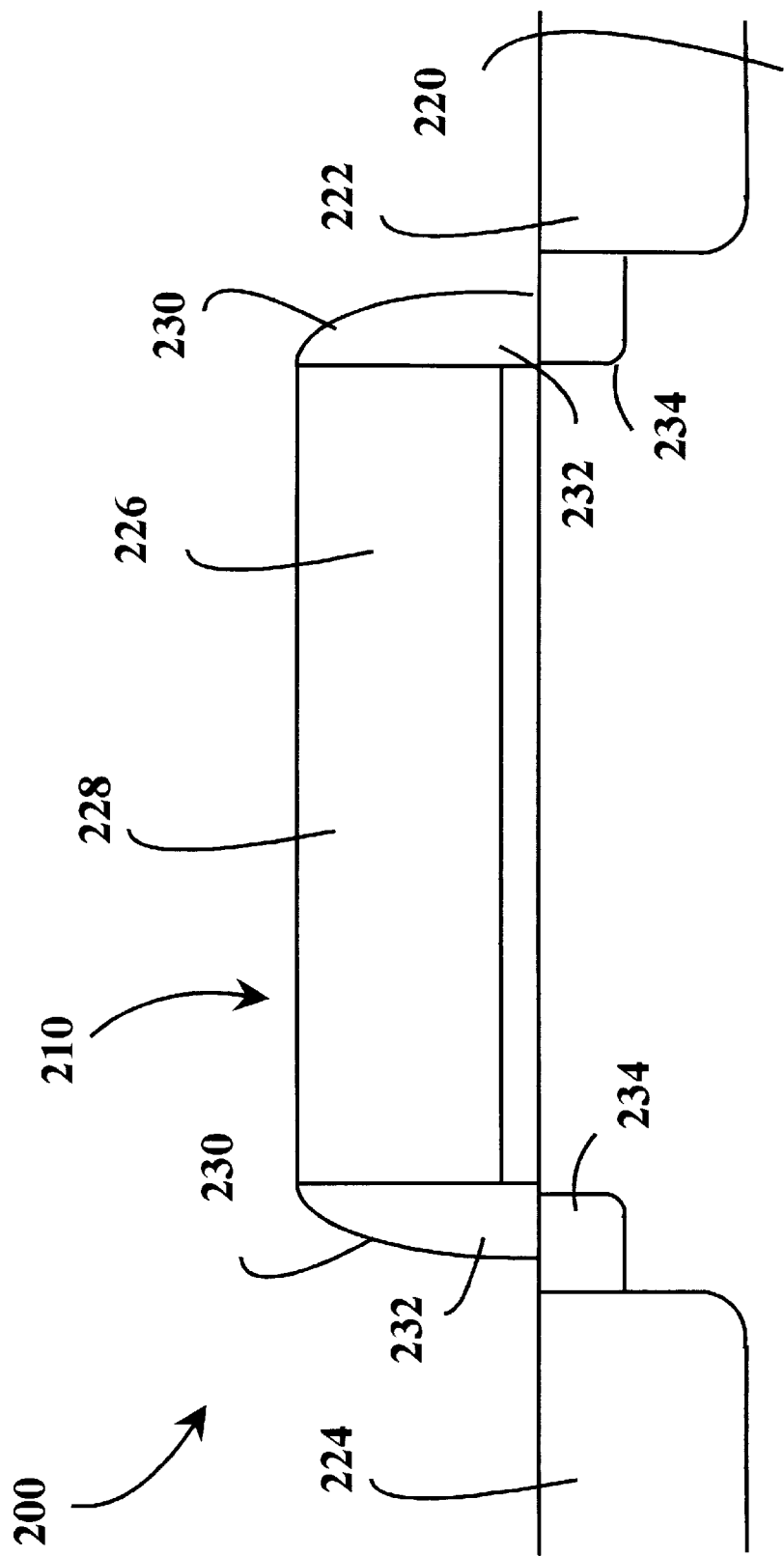
FIG. 2 is cross-sectional view of a semiconductor wafer including a MOS transistor.

Referring to FIG. 2, a cross-sectional view of a semiconductor wafer 200 shows a MOS transistor 210 including a semiconductor substrate 220, a source diffusion 222, a drain diffusion 224 and a gate 226 formed from a gate oxide layer 228. The MOS transistor 210 has spacers 230 formed from spacer oxide 232 on the sides of the gate 226. Lightly doped drain (LDD) regions 234 are diffused into the substrate 220 underlying the spacers 230.

Figure 3:
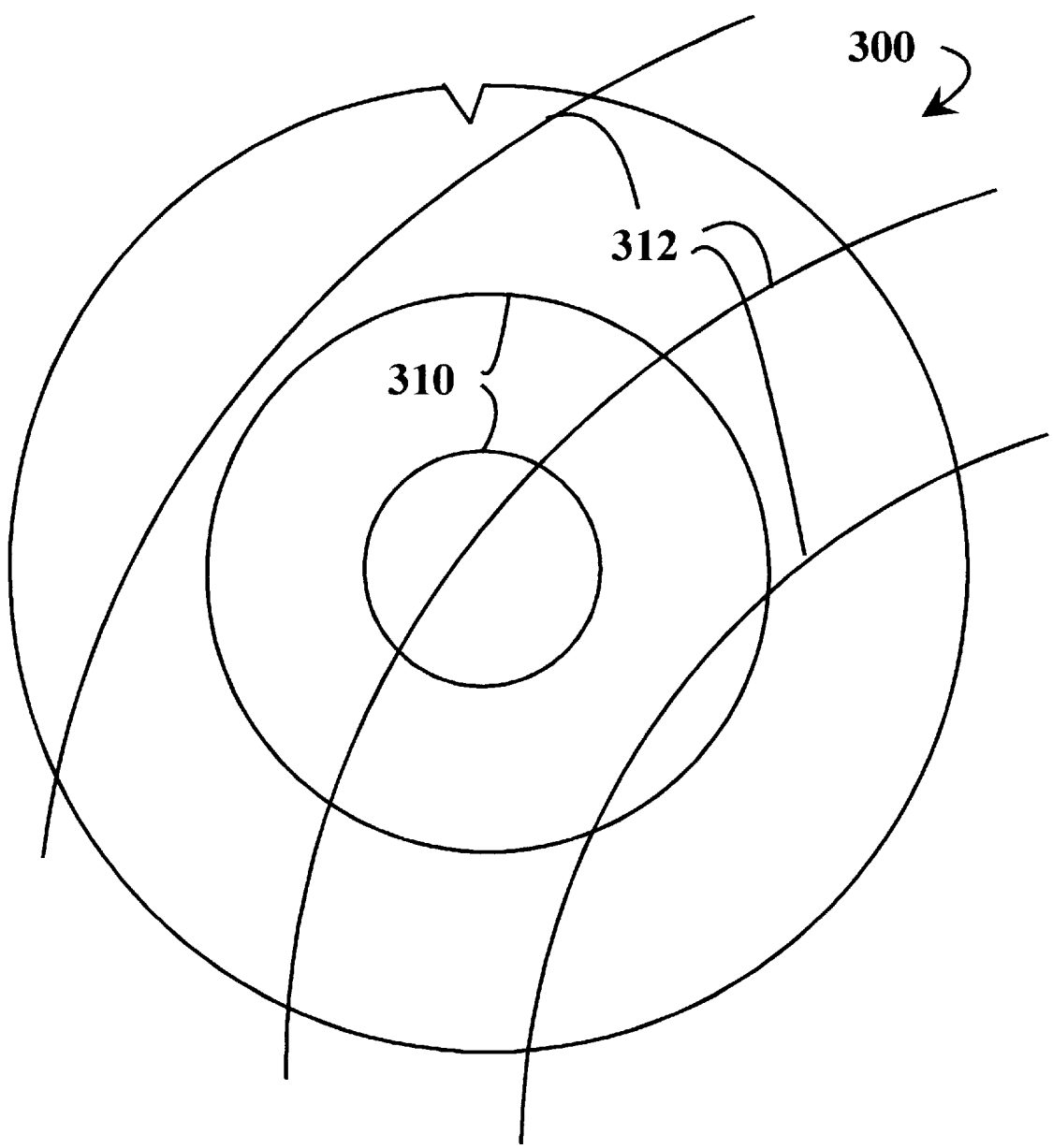
FIG. 3 is a top pictorial view of a semiconductor wafer which shows a distribution of gate oxide thickness on the wafer.
Figure 4:
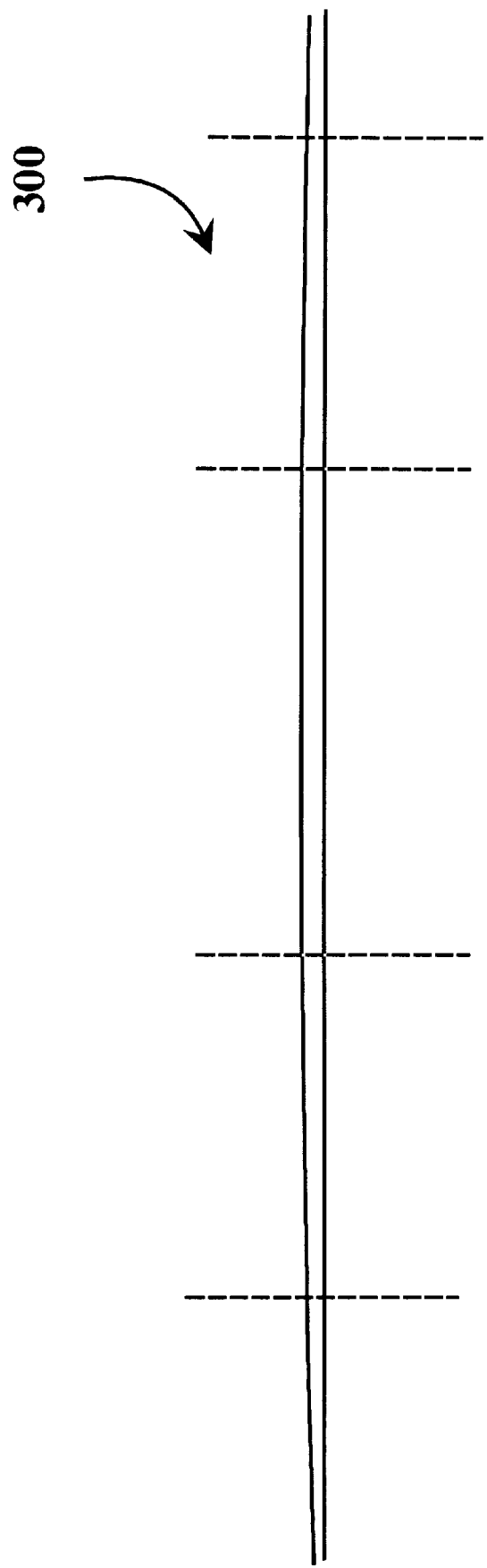
FIG. 4 is a cross-sectional view of a semiconductor wafer which shows a distribution of gate oxide thickness on the wafer.

Referring to FIGS. 3 and 4, respectively a top pictorial view and a cross-sectional view of a semiconductor wafer 300 illustrate a gate oxide thickness distribution 310 on the wafer 300. Several methods of measuring gate oxide thickness are known in the semiconductor processing art. For example, gate oxide thickness is measured using a scanning electron microscope (SEM) micrograph. An electron microscope uses a beam of electrons to investigate a sample to achieve a higher magnification than is possible using an optical microscope.

In other embodiments, gate oxide thickness is measured using an optical interference method in which a spectrophotometer supplies an incident light beam in the UV to visible range (480–790 nm). The incident wavelength of the light is varied as the incident angle is held constant. Reflected light intensity is measured as a function of wavelength.

Gate oxide thickness may also be measured using ellipsometry which furnishes a nondestructive optical technique for measuring oxide thickness as well as the optical index of refraction at the measuring wavelength. The ellipsometry technique uses the change in state of the polarization of light when light is reflected from a surface. The state of polarization is determined by the relative magnitude of parallel and perpendicular components of the radiation and by the phase difference between the parallel and perdendicular components. The polarization change depends on the optical constants of the silicon, the angle of incidence of the light, the optical constants of the oxide film and the oxide film thickness. If the optical contants of the substrate are known and the film is non-absorptive at the test wavelength, then the state of polarization of the reflected beam depends on the optical contstants and the thickness of the gate oxide film.

In other embodiments, the gate oxide thickness is measured using a capacitance method but requires the fabrication of a MOS capacitor. Gate oxide thickness is determined as a function of measured oxide capacitance, area of the gate, dielectric constant of the silicon dioxide of the gate and the free space permittivity.

In still other embodiments, gate oxide thickness may be measured using an oxide film color chart in which various oxide thicknesses are grown and measured by ellipsometry or optical interference. A color chart is prepared from the thickness samples and compared to gate oxide samples.

Growth of defect-free, thin (15–100 nm), high-quality, noncontaminated, uniform thickness gate oxide is important for device operation. Drain current in a MOS transistor is inversely proportional to gate thickness so that gate oxide is normally made as thin as possible considering oxide breakdown and reliability considerations. However, gate oxide thickness is typically not constant across the wafer 300 but instead has a pattern that is determined by multiple various oxidation growth parameters. These parameters include the crystallographic orientation of silicon in the wafer, the silicon doping level, the presence of halogen impurities (Cl, HCl, TCA, TCE, for example) in the gas phase of the oxidation, growth pressure, the presence of plasma during growth and the presence of photon flux during growth. These parameters are greatly dependent on the type of semiconductor processing equipment, the various chemicals and physical parameters such as temperatures and pressures that are used during processing. Thus, the gate oxide thickness distribution 310 may take various different forms. In the present example, shown in FIGS. 3 and 4, various parameters such as growth pressure and temperature distributions within the circular disk wafer may result in a radial pattern of gate oxide thickness. A radial distribution of gate oxide thickness results from various nonuniformities that occur during processing, including variations in gas flow, temperature and pressure. A second parameter that influences the form of the gate oxide thickness distribution 310 is temperature inhomogeneities arising from convection currents at high pressures resulting in poor thickness uniformity. This poor thickness uniformity is illustrated by topographical thickness lines 312 shown in FIG. 3 that intersect the radial distribution 310. In one processing apparatus, the diagonal topographical thickness lines 312 are created by a vertically disposed furnace which produces a gas flow on one side of the wafer 300.

In some processing systems, the topographical thickness lines 312 predominate over the radial gate oxide thickness distribution 310.

Figure 5:
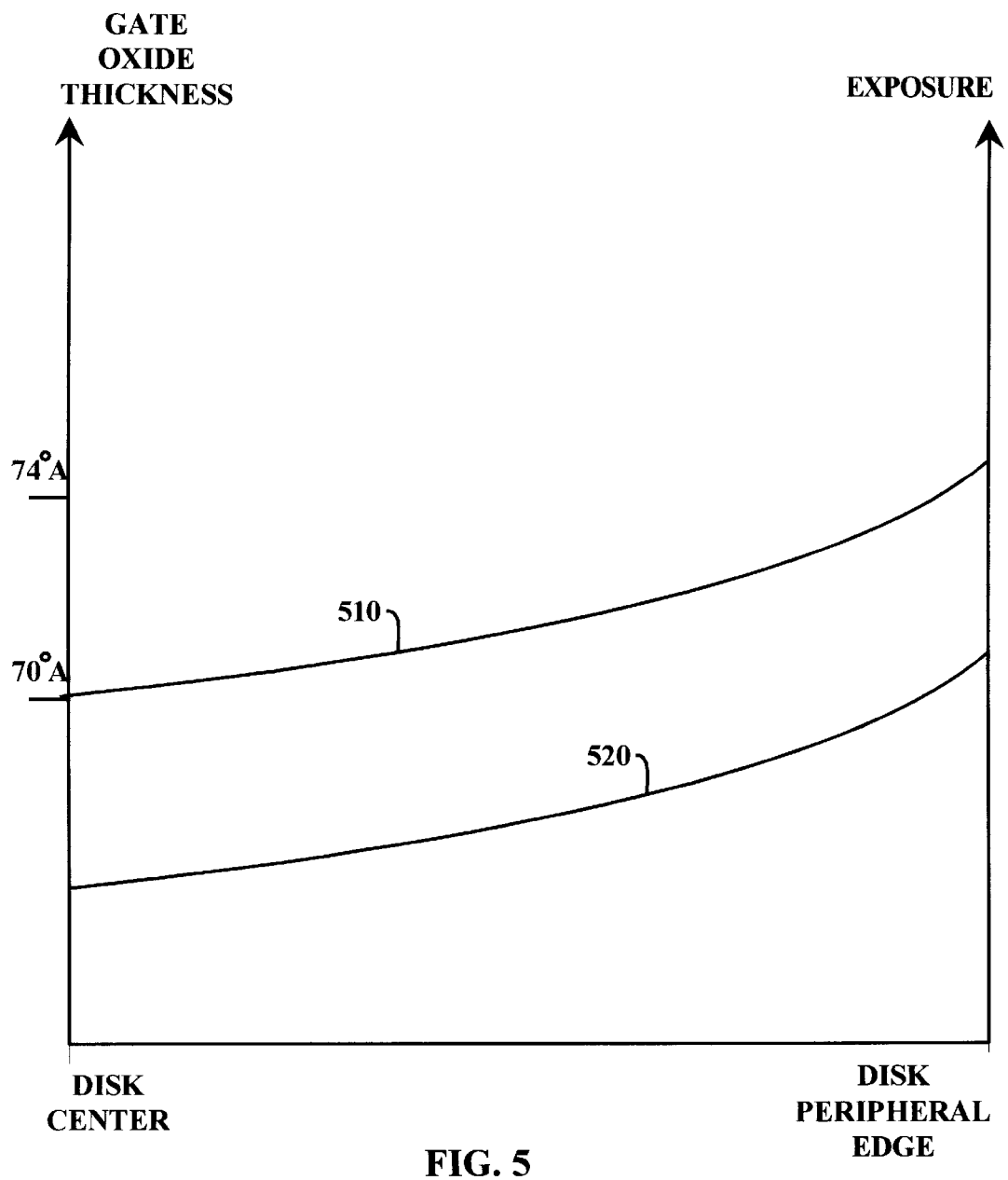
FIG. 5 is a graph illustrating a distribution of gate oxide thickness on a wafer and a distribution of lithographic light exposure applied for controlling drive current uniformity across the wafer.

Referring to FIG. 5, a graph illustrates a distribution 510 of gate oxide thickness on the semiconductor wafer and a distribution 520 of lithographic light exposure. In this example, gate oxide thickness varies across the semiconductor wafer 300 approximately from a thickness of 70 angstroms at the center of the semiconductor wafer disk to a thickness of about 74 angstroms at the outer edge of the disk.

The drive current of a transistor device varies according to gate oxide thickness. For a thicker gate oxide layer, as compared to a thinner layer, a larger voltage is necessary to inject the same amount of charge into the channel region of a transistor, resulting in a reduced drive current. Accordingly, a wider gate oxide thickness causes the drive current to decrease, a thinner gate oxide thickness causes the drive current to increase. Thickening of the gate oxide is compensated by increasing the light exposure applied to the transistor, thereby reducing the channel width. Accordingly, increased light exposure is applied to regions of thick gate oxide on the semiconductor substrate so that the channel width of the transistor devices in the thick gate oxide regions is reduced, raising the drive current in these regions so that the drive current over the entire semiconductor wafer is substantially constant.

The light exposure is controlled across the semiconductor wafer 300 to improve drive current uniformity across the wafer 300. In conventional semiconductor processing, the same exposure is applied at all locations of the wafer, to every wafer in a processing lot, without taking into account variations in gate oxide thickness across a wafer. FIG. 5 shows, in an embodiment of the present invention, that the exposure is varied across the semiconductor wafer 300 to make drive current uniform across the wafer 300. Specifically, the exposure applied to the wafer 300 is lower at the center of the wafer 300 where the gate oxide thickness is smaller and is increased radially in proportion to the increase in gate oxide thickness toward the periphery of the semiconductor wafer 300. In this manner, light exposure applied to the semiconductor wafer 300 is varied to compensate for differences in gate oxide thickness.

The effect of gate oxide thickness on the drive current is determined by measuring the drive current of multiple transistor devices fabricated at various positions on the semiconductor wafer and correlating the measured drive current with the measured gate oxide thickness at corresponding positions of the semiconductor wafer.

Figure 6:
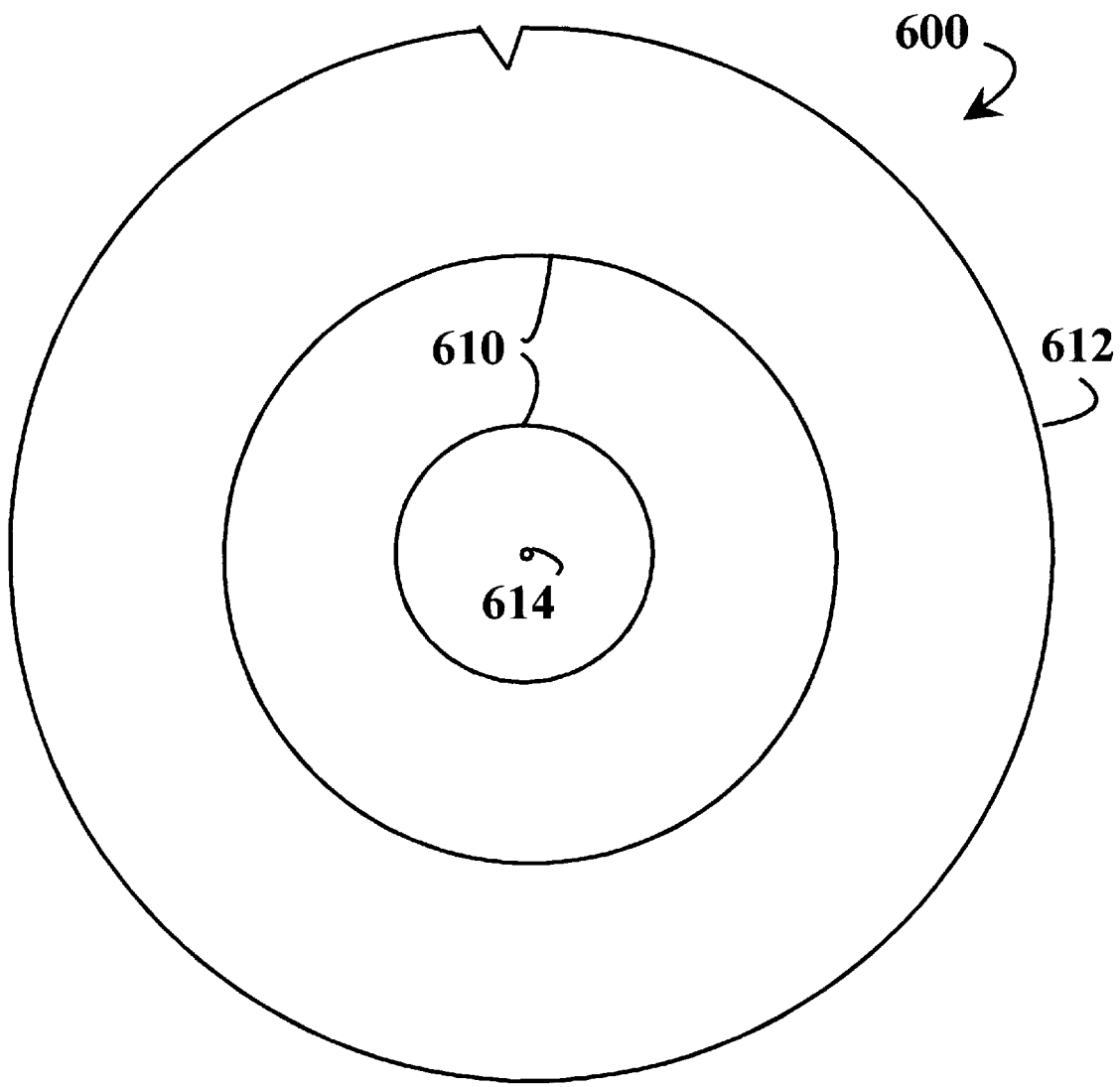
FIG. 6 is a top pictorial view of a semiconductor wafer which shows a distribution of polysilicon etch bias on the wafer.

Referring to FIG. 6, a top pictorial view of a semiconductor wafer 600 illustrates a polysilicon etch bias distribution 610 on the wafer 600. Polysilicon etch bias is the difference in lateral dimension between an etched structure and a mask structure. Accordingly, the etch bias is a measure of uniformity of etching. Variation in polysilicon etch bias leads to dimensional variability in transistor structures such as channel widths, source and drain diffusion position and the like, ultimately resulting in nonuniformity in drive current across a semiconductor wafer 600. Polysilicon etch bias is typically nonuniform across the wafer 600 and has a pattern that is determined by multiple various parameters. These parameters include variations in temperature, plasma density, and gas flow. The parameters also include loading effects, as well as uniformity of polysilicon deposition on the wafer and uniformity of photoresist coating on the semiconductor wafer 600. For example, the structure and properties of polysilicon depend substantially on the deposition temperature, dopant type and concentration and subsequent thermal cycling. These parameters generally determine the crystalline or amorphous character of the polysilicon. In addition, photoresist typically may have a nonuniform thickness across the semiconductor wafer 600 that arises from spin coating of the wafer 600 with photoresist. In the example shown in FIG. 6, the combined variation in thickness uniformity of the polysilicon and the photoresist result in a polysilicon etch bias variability having a radial form in which the polysilicon etch bias is greater toward the center of the semiconductor wafer disk 600 and decreases substantially monotonically as the radial distance from the center increases to the edge of the disk. In accordance with the polysilicon bias etch distribution 610 shown in FIG. 6, the semiconductor wafer 600 may be radially partitioned so that a photolithographic process is applied in which exposure is controlled to change the exposure intensity in a radial pattern so that the exposure is changed moving from the center 614 towards the edge 612 of the wafer 600.

In some embodiments, polysilicon etch bias is measured using a scanning electron microscope (SEM) micrograph. An electron microscope uses a beam of electrons to investigate a sample to achieve a higher magnification than is possible using an optical microscope.

Figure 7:
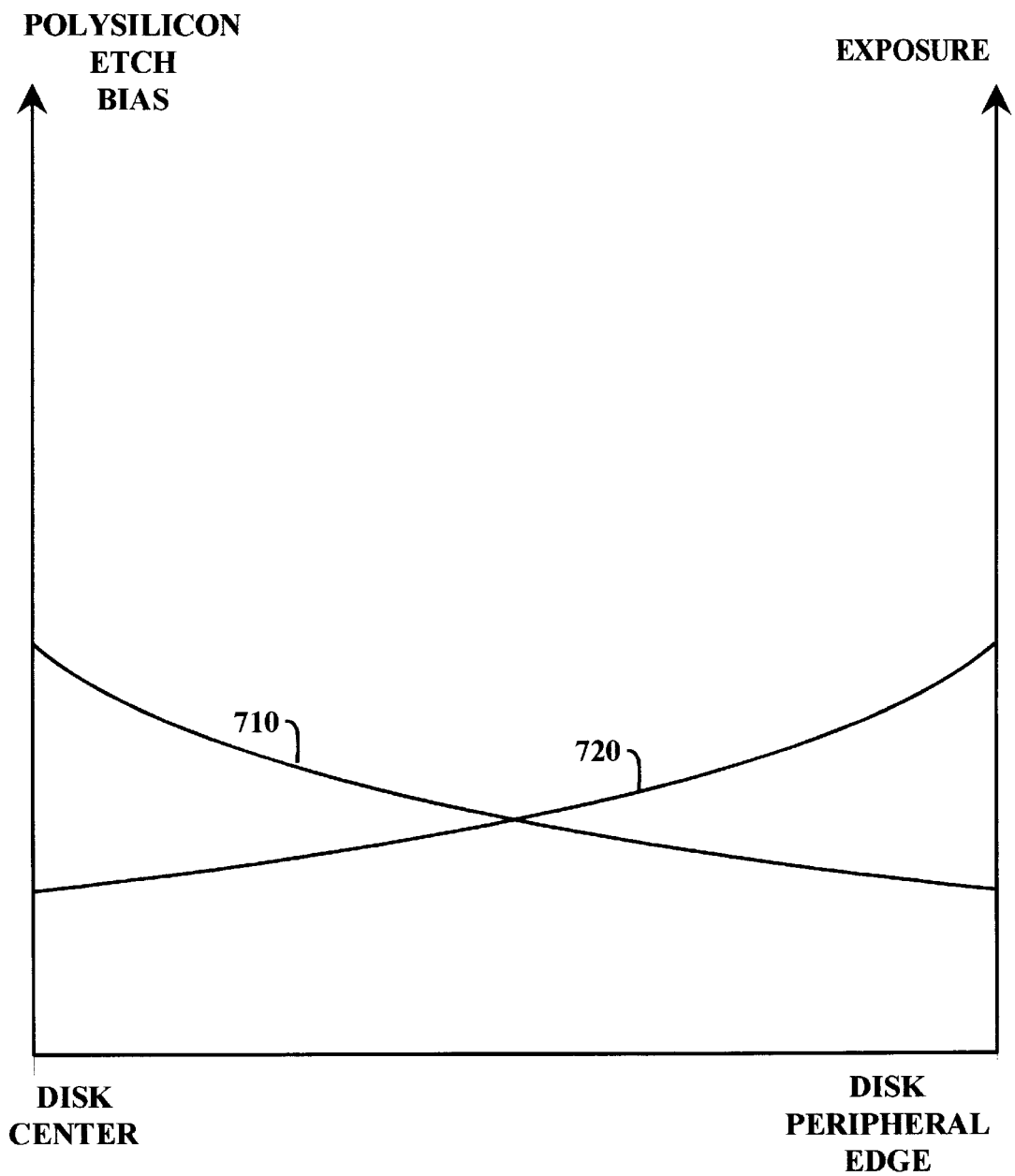
FIG. 7 is a graph illustrating a distribution of polysilicon etch bias on a wafer and a distribution of lithographic light exposure applied for controlling drive current uniformity across the wafer.

Referring to FIG. 7, a graph illustrates a distribution 710 of polysilicon etch bias on the semiconductor wafer 600 and a distribution 720 of lithographic light exposure. In this example, polysilicon etch bias varies across the semiconductor wafer 600 from a relatively high etch bias at the center of the semiconductor wafer disk 600 to a low etch bias at the periphery of the disk. Polysilicon etch bias controls the drive current of a transistor. In particular, a larger polysilicon etch bias causes the drive current to be more nonuniform, a smaller polysilicon etch bias causes the drive current to be more uniform across the semiconductor wafer 600.

The light exposure is controlled across the semiconductor wafer 600 to improve drive current uniformity across the wafer 600. FIG. 7 shows, in an embodiment of the present invention, that the exposure is varied across the semiconductor wafer 600 to make drive current uniform across the wafer 600. Specifically, the exposure applied to the wafer 600 is lower at the center of the wafer 600 where the polysilicon etch bias is larger and is increased radially in proportion to the reduction in polysilicon etch bias toward the periphery of the semiconductor wafer 600. In this manner, light exposure applied to the semiconductor wafer 600 is varied to compensate for differences in polysilicon etch bias.

The effect of polysilicon etch bias on the drive current is determined by measuring the drive current of multiple transistor devices fabricated at various positions on the semiconductor wafer and correlating the measured drive current with the measured polysilicon etch bias measurements at corresponding positions of the semiconductor wafer.

Figure 8:
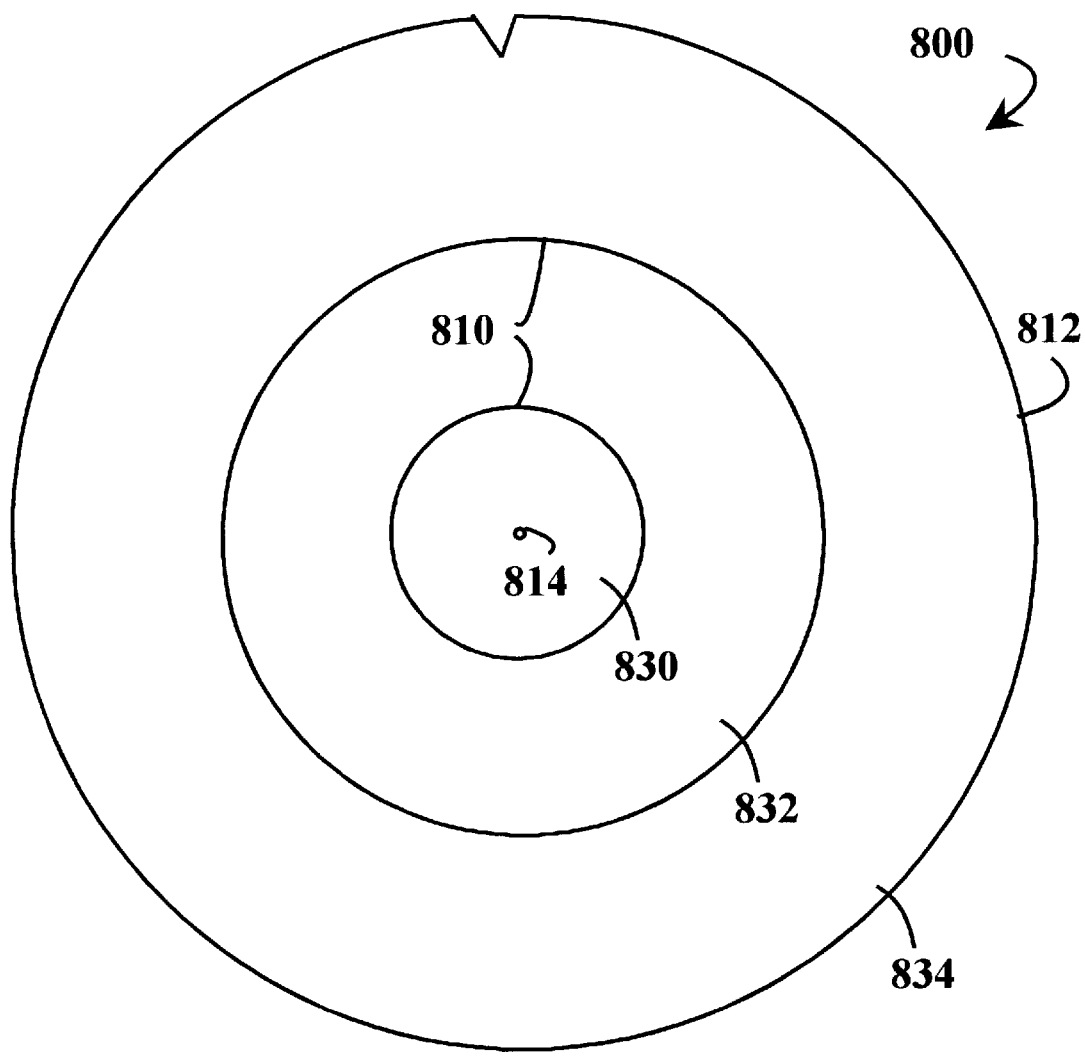
FIG. 8 is a top pictorial view of a semiconductor wafer which shows a distribution of rapid thermal annealing (RTA) on the wafer.

Referring to FIG. 8, a top pictorial view of a semiconductor wafer 800 illustrates a rapid thermal annealing (RTA) temperature distribution 810 on the wafer 800. Semiconductor wafers are subjected to many elevated temperature steps during integrated circuit fabrication. Integrated circuit devices are fabricated by creating precisely controlled regions of dopants in the wafers. Thermal treatments can cause the dopants to diffuse, reducing control of dopant concentration and locations. Rapid thermal annealing (RTA) is short-term, high temperature processing to reduce dopant diffusion while still achieving a desired process effect.

Optimal RTA processing is achieved when the temperature across the semiconductor wafer 800 is uniform and constant. However, because of the manner in which the semiconductor wafer 800 is mounted during RTA processing, heating and cooling of the wafer is variable in a radial pattern, as shown by the RTA temperature distribution 810. One consequence of the variable RTA temperature distribution 810 is that the dopant of the lightly doped drain (LDD) diffusion (234 shown in FIG. 2) diffuses further under the gate 226, causing detrimental "hot-carrier effects" in a transistor. Hot-carrier effects are caused by hot electrons that are generated by impact ionization and injected into the silicon oxide of a transistor. The hot electrons are trapped near the drain 224 and shorten the effect channel length $L_{eff}$. The injected and trapped hot electrons also produce a reduction in transistor threshold voltage $V_T$, an increase in transistor transconductance $g_m$ and an increase in drive current. The variation in RTA temperature distribution 810 has a radial form in which the RTA temperature is greater toward the center of the semiconductor wafer disk 800 and decreases substantially monotonically as the radial distance from the center increases to the edge of the disk. In accordance with the RTA temperature distribution 810 shown in FIG. 8, the semiconductor wafer 800 may be radially partitioned so that a photolithographic process is applied in which exposure is controlled to change the exposure intensity in a radial pattern so that the exposure is changed moving from the center 814 towards the edge 812 of the wafer 800. In one example, the light exposure is controlled across the semiconductor wafer 800 in a radial pattern so that the exposure in a center region 830 is, for example, 400 mJ, in an incremental radial region 832 an exposure of 402 mJ is applied and a next incremental radial region 834 has an applied exposure of 404mJ.

Figure 9:
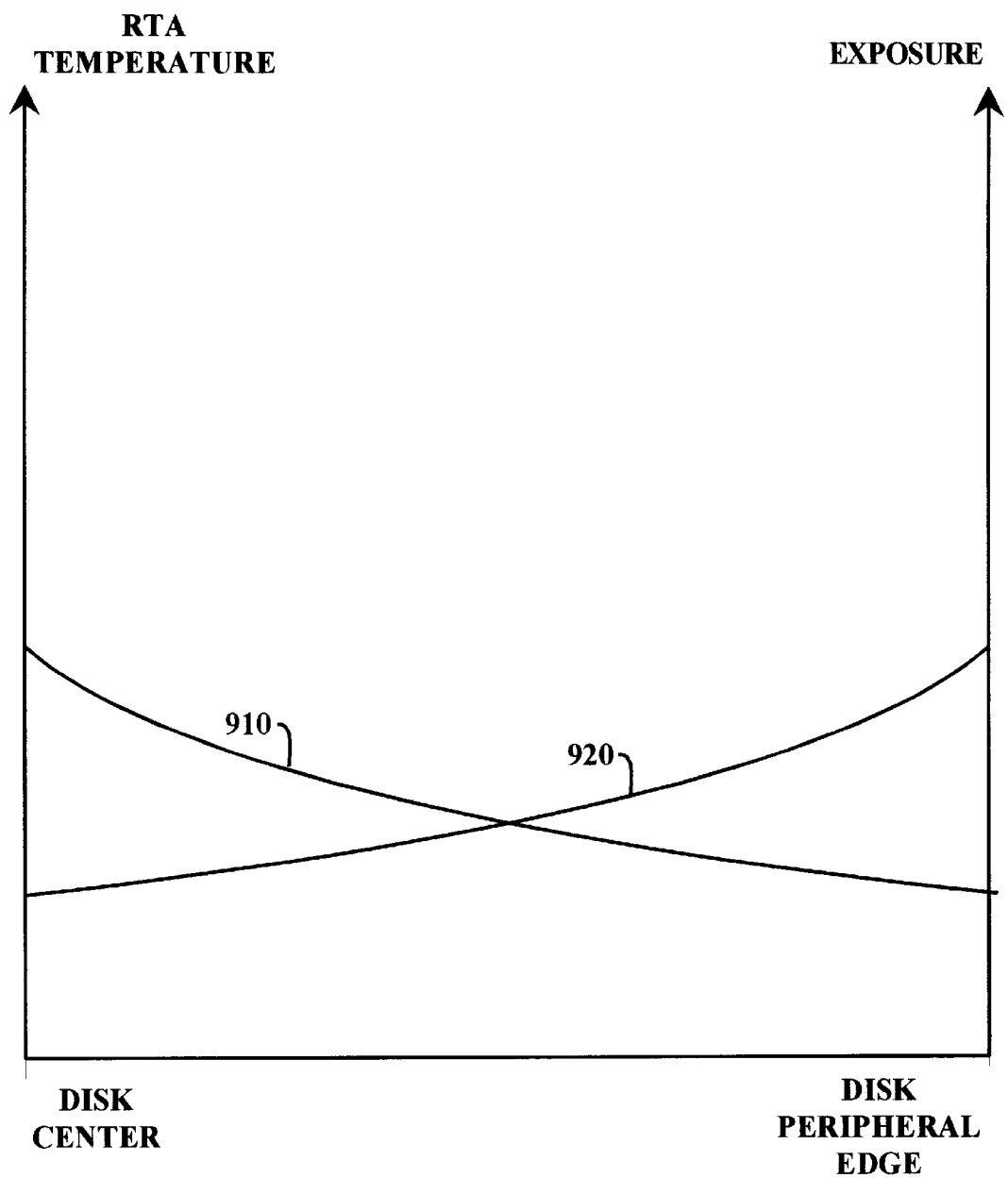
FIG. 9 is a graph illustrating a distribution of rapid thermal annealing (RTA) temperature on a wafer and a distribution of lithographic light exposure applied for controlling drive current uniformity across the wafer.

Referring to FIG. 9, a graph illustrates a distribution 910 of RTA temperature on the semiconductor wafer 800 and a distribution 920 of lithographic light exposure. In this example, RTA temperature varies across the semiconductor wafer 800 from a relatively high etch bias at the center of the semiconductor wafer disk 800 to a low etch bias at the periphery of the disk. RTA temperature controls the drive current of a transistor. In particular, a larger RTA temperature reduces effective channel length $L_{eff}$ of a device, reduces transistor threshold voltage $V_T$, increases transistor transconductance $g_m$ and increases drive current. A smaller RTA temperature increases effective channel length $L_{eff}$ of a device, increases transistor threshold voltage $V_T$, decreases transistor transconductance $g_m$ and decreases drive current.

In some embodiments, RTA temperature is measured using several thermocouples, as are known in the art of semiconductor processing. A thermocouple uses two dissimilar metals at each end to form an electrical circuit. If the two junctions are maintained at different temperatures, an electromotive force (EMF) is developed between the junctions.

The light exposure is controlled across the semiconductor wafer 800 to improve drive current uniformity across the wafer 800. FIG. 9 shows, in an embodiment of the present invention, that the exposure is varied across the semiconductor wafer 800 to make drive current uniform across the wafer 800. Specifically, the exposure applied to the wafer 800 is lower at the center of the wafer 800 where the RTA temperature is larger and is increased radially in proportion to the reduction in RTA temperature toward the periphery of the semiconductor wafer 800. In this manner, light exposure applied to the semiconductor wafer 800 is varied to compensate for differences in RTA temperature.

The effect of RTA temperature on the drive current is determined by measuring the drive current of multiple transistor devices fabricated at various positions on the semiconductor wafer and correlating the measured drive current with the measured RTA temperature at corresponding positions of the semiconductor wafer.

Figure 10:
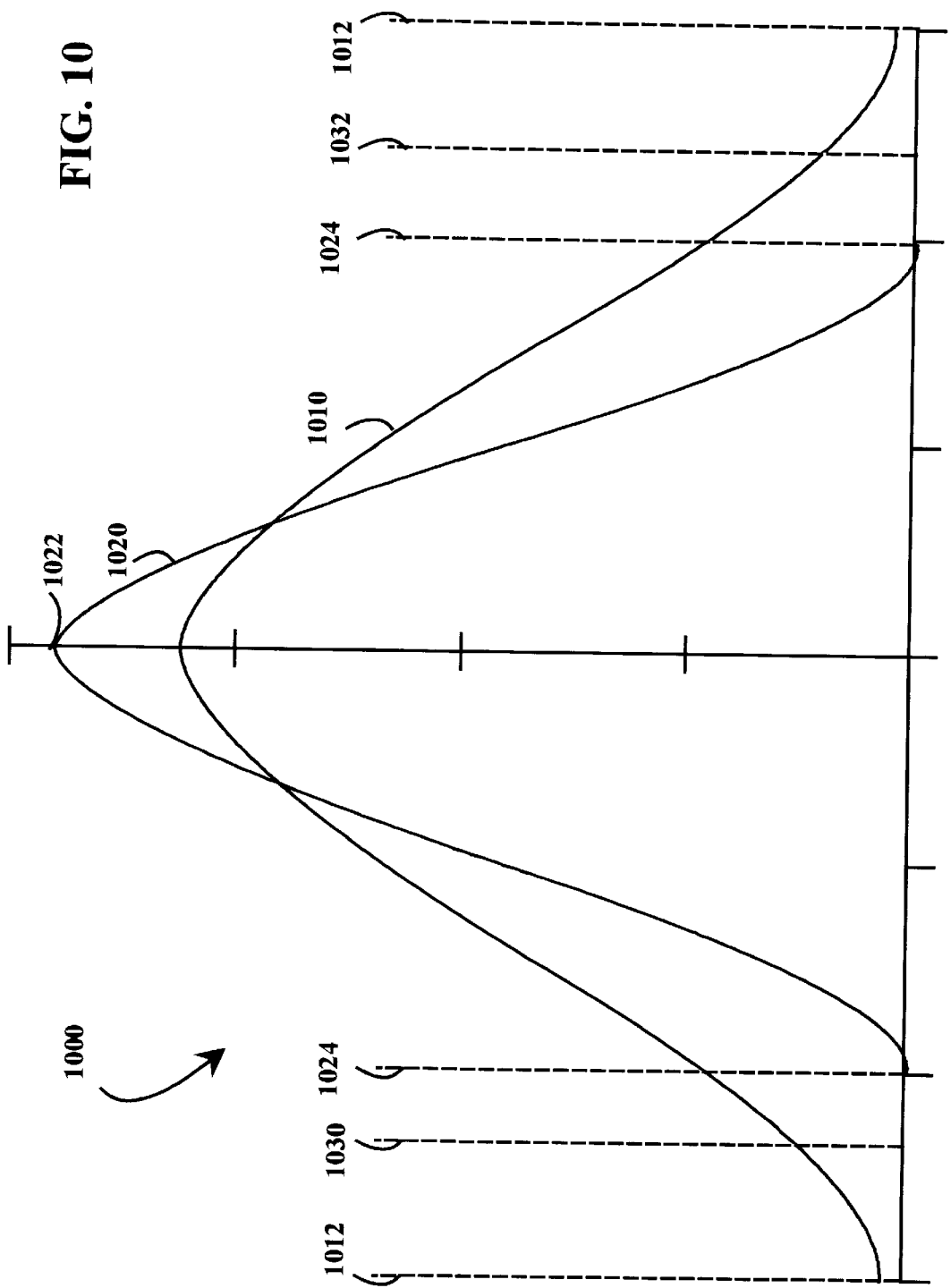
FIG. 10 is a graph which illustrates a distribution of drive current values for a plurality of transistor devices on a semiconductor wafer.

Referring to FIG. 10, a current drive distribution graph 1000 illustrates a distribution of drive current values for a plurality of transistor devices on a semiconductor wafer. The abscissa of the current drive distribution graph 1000 represents the current drive values for a plurality of transistor devices. The ordinate of the current drive distribution graph 1000 represents the number of devices having a particular current drive value. A conventional current drive distribution 1010 shows the current drive distribution of a typical conventional semiconductor wafer. A line representing an improved current drive distribution 1020 depicts the current drive distribution of a semiconductor wafer using controlled light exposure to improve current drive uniformity. The improved current drive distribution 1020 typically has a gaussian form about a central approximation value, such as a mean or nominal value 1022. A three-sigma statistical measure 1012 for the conventional current drive distribution 1010 and a three-sigma statistical measure 1024 for the improved current drive distribution illustrate compaction of the current drive distribution achieved by the controlled light exposure method. A lower specification limit 1030 and an upper specification limit 1032 are designated. Transistor devices having a current drive smaller than the lower specification limit 1030 and transistor devices having a current drive greater than the upper specification limit 1032 are discarded.

The disclosed processing method is expected to typically reduce the variation in current drive distribution by one-sigma (one standard deviation). The current drive distribution is tightened, tails of the distribution are substantially eliminated so that essentially no transistor devices have a current drive outside an allowable range. This substantial reduction in variation in current drive distribution allows a fabricated integrated circuit to be operated at a higher speed by increasing the drive current while leakage current is maintained at a low level. In particular, the improved current drive distribution 1020 is compact about the nominal value 1022 so that very few devices have a current drive below the lower specification limit 1030 so that the nominal value 1022 may be increased without increasing the number of devices that are discard due to a low current drive. In this manner, the operating frequency of an integrated circuit is advantageously increased. The light exposure is varied across the semiconductor wafer so that the current drives of devices in the entire distribution is increased, allowing a faster operating frequency. For example, the operating frequency of an integrated circuit may be increased by an amount of the order of tens of megahertz.

The basis for such an increase in operating frequency is grounded in analysis of statistical parameters. One statistical parameter is a process capability index $C_p$, which is the ratio of the allowable specification to the width of the distribution of the process characteristic to six standard deviations. The process capability index $C_p$ is applicable to two-sided statistical distributions. Another statistical parameter is a one-sided process capability index $C_{pk}$, which is the ratio of the distance from the specification limit to the process average, divided by three standard deviations. The one-sided process capability index $C_{pk}$ describes how well a current drive distribution for a plurality of devices in a semiconductor wafer fits within the specification limit bounded by the lower specification limit 1030 and the upper specification limit 1032. The larger a $C_{pk}$ value of a distribution, the more integrated circuit devices that do not meet a defined specification so that more devices are discarded.

Figure 11:
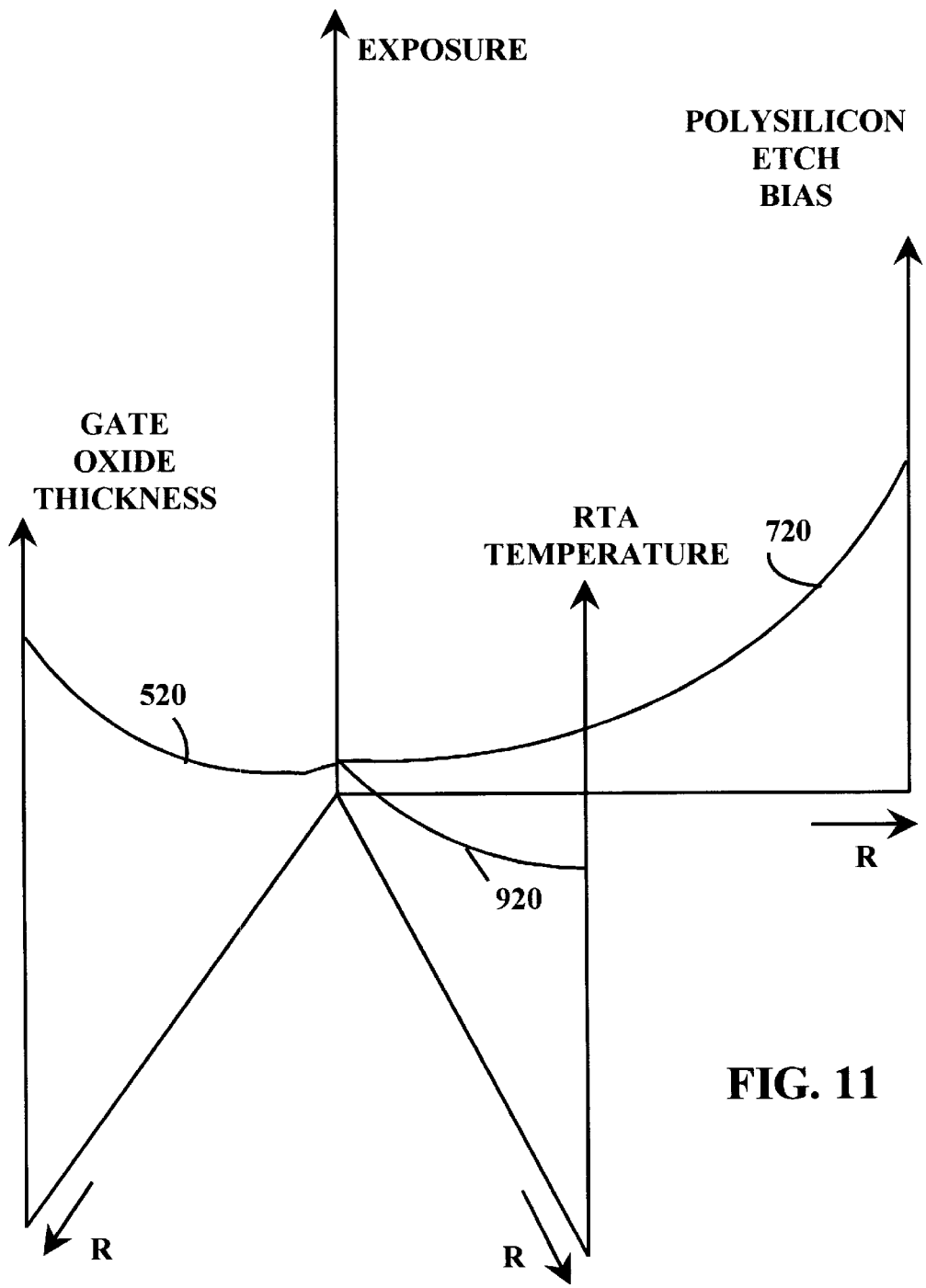
FIG. 11 is a graph illustrating a plurality of distributions of parameters that affect current density for determining a distribution of lithographic light exposures applied to control drive current uniformity across the wafer.

Referring to FIG. 11, a graph illustrates a plurality of exposure functions to compensate for variations in parameters including a gate oxide thickness function 520, a polysilicon etch bias function 720 and an RTA temperature function 920 that affect current density. These exposure functions are combined to determine a distribution of lithographic light exposures applied to control drive current uniformity across the wafer. A light exposure distribution across a semiconductor wafer is determined to compensate for each parameter of the plurality of parameters. In particular, the light exposure is increased from the center to the edge of a wafer to compensate for each of the gate oxide thickness distribution 510, the polysilicon etch bias distribution 610 and the RTA temperature distribution 910, which are respectively illustrated in FIGS. 5, 7 and 9. In other embodiments of a silicon processing method, different light exposure distributions may be applied to compensate for various parameters. In some embodiments, the light exposure may be increased from the edge to the center of a wafer. Also, different parameters may be compensated by opposing light exposure distributions so that, for example, the combined changes in light exposure distribution may partially or completely cancel. In some method embodiments, the pattern of light exposure may be patterns other than a radial pattern.

Figure 12:
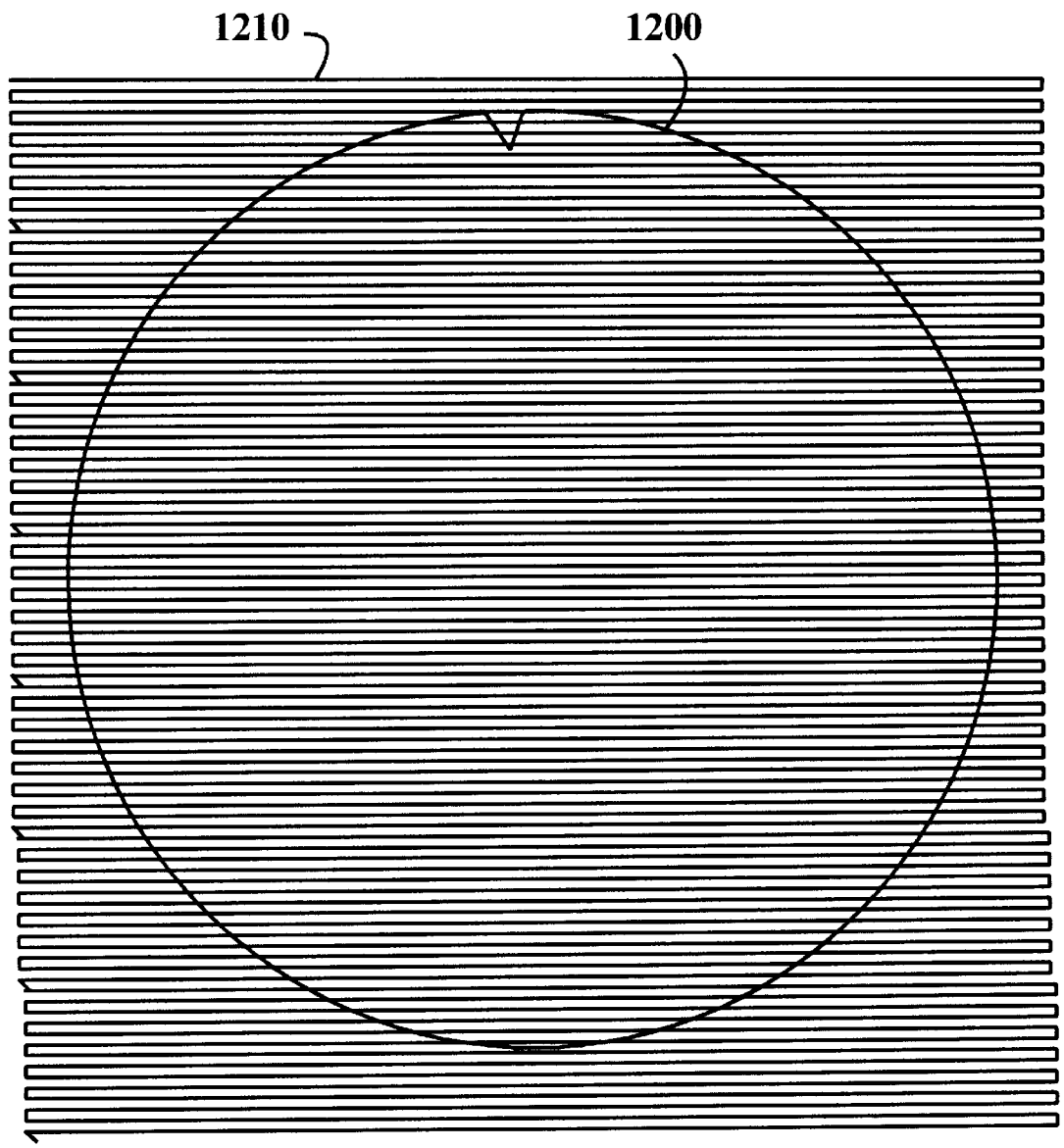
FIG. 12 is a top pictorial view of a semiconductor wafer which illustrates a scanning pattern of an apparatus for applying light exposure.

Referring to FIG. 12, a top pictorial view of a semiconductor wafer 1200 illustrates a scanning pattern 1210 of a scanning apparatus (not shown) for applying light exposure. The scanning apparatus, which is known in the semiconductor processing arts, includes a stepper for scanning a field in an x-y rectilinear pattern. The scanning apparatus also includes a controller that controls positioning of an illuminator within a field, the exposure intensity or energy and exposure time at each position in the scan field. The scanning apparatus is programmable so that an applied scan formula of exposure intensities, for example in mJ, and durations, for example in seconds, is easily saved and modified. A semiconductor wafer may be exposed in any manner using this scanning pattern 1210 by individually and independently setting the intensity and duration of illumination applied at each point in the scan field. In addition, more precise control is made possible by having a programmable selection of distance step size in the x-y field of the scanner.

In various embodiments, different types of illuminators may be employed. Using a photolithography technique, a deep ultraviolet illumination exposure is applied to the semiconductor wafer. In another embodiment, an X-ray lithography system is employed in which X-rays, rather than light beams, are used to expose appropriate photoresists. In further additional embodiments, the wafers are illuminated with electron beams in which a beam of electrons are usually emitted from a single source, such as a thermionic cathode. Using ion-beam lithography, which is similar to electron-beam lithography, a semiconductor wafer is exposed to a beam of ions, rather than a beam of electrons, resulting in a greater photoresist sensitivity and a reduced writing time.

Figure 13:
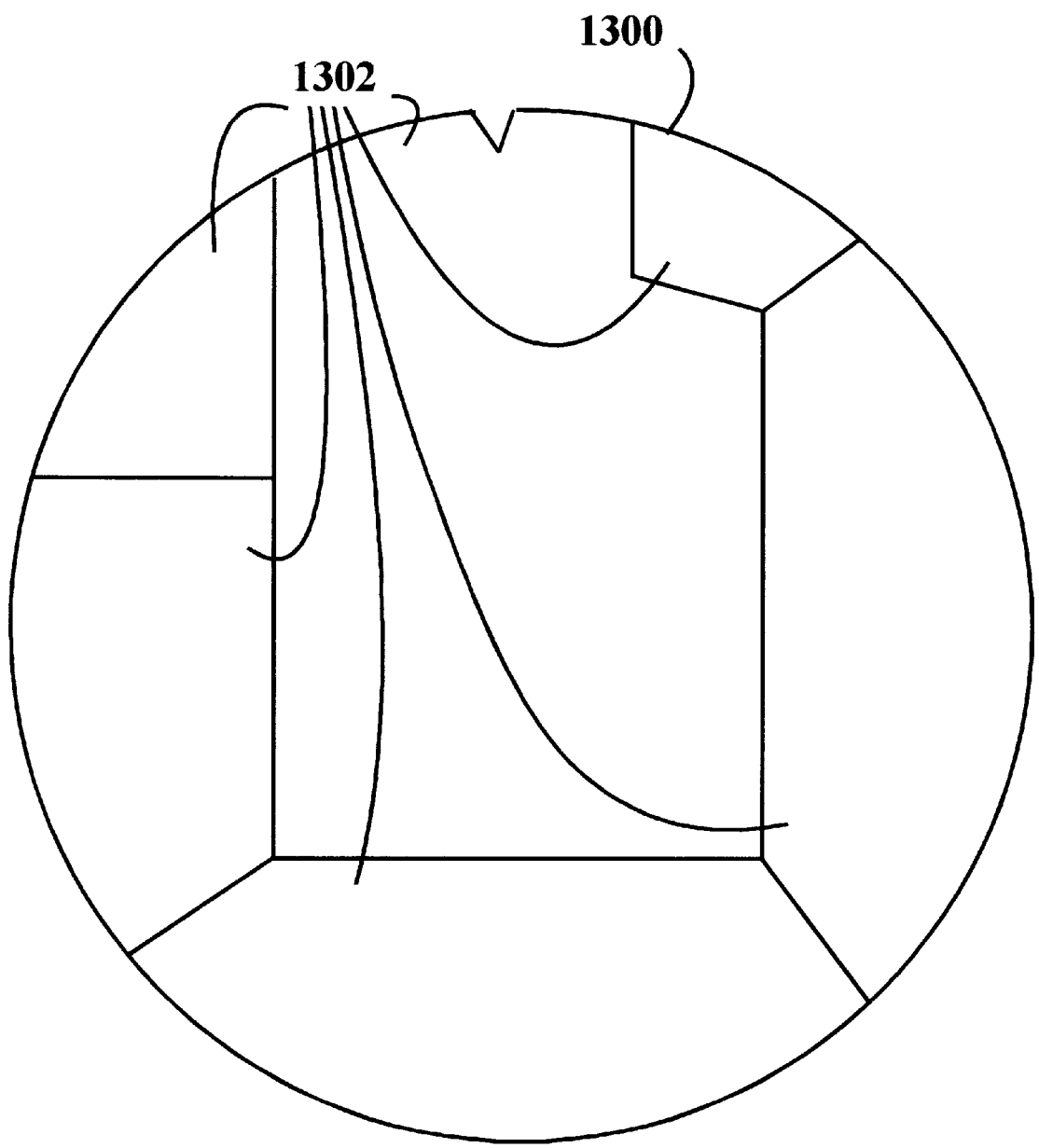
FIG. 13 is a top pictorial view of a semiconductor wafer which shows partitioning of the wafer into a plurality of areas.

Referring to FIG. 13, a top pictorial view of a semiconductor wafer 1300 shows partitioning of the wafer 1300 into a plurality of areas. The semiconductor wafer 1300 is partitioned into a plurality of areas 1302. A photolithographic process is applied in which the exposure in each of the plurality of areas 1302 is individually and independently controlled as a finction of position on the wafer to account for variations in drive current that result from gate oxide thickness, polysilicon etch bias, rapid thermal annealing temperature and other parameters. The exposure applied to an area 1302 is controlled to account for a single processing parameter or a plurality of parameters in combination.

Figure 14:
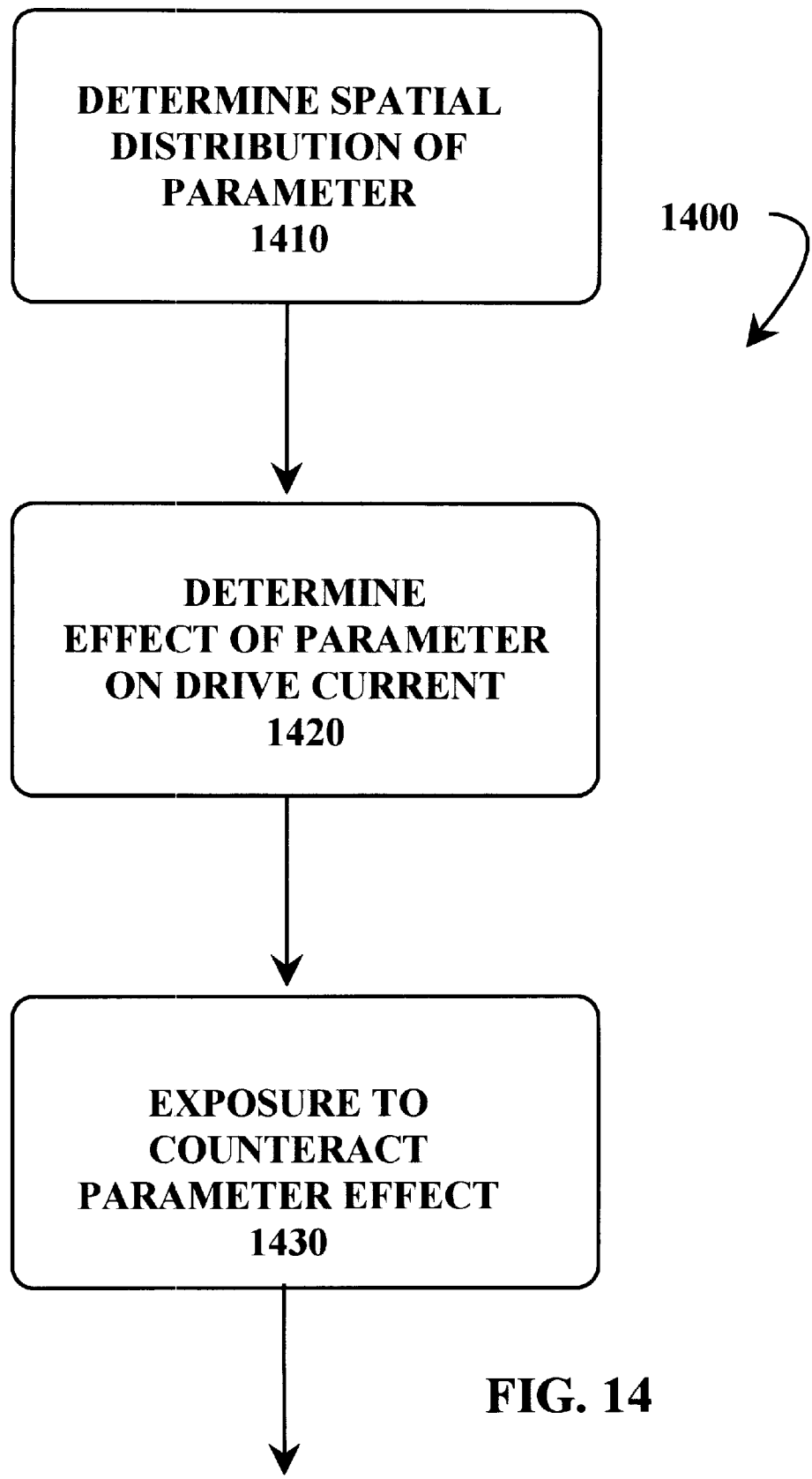
FIG. 14 is a flow chart which illustrates a method of controlling a drive current spatial distribution on a semiconductor wafer during fabrication of an integrated circuit.

Referring to FIG. 14, a flow chart illustrates a method 1400 of controlling a drive current spatial distribution on a semiconductor wafer during fabrication of an integrated circuit. In a first step 1410, a parameter that effects drive current, such as gate oxide thickness, polysilicon etch bias or RTA temperature is measured in multiple locations on a semiconductor wafer to determine the spatial distribution of the parameter. In second step 1420, the effect of the parameter on the drive current is determined, generally by measuring the drive current of devices fabricated at various positions on the wafer and correlating the drive current of these locations with the parameter values at corresponding positions. In step 1430, the semiconductor wafer is exposed to illumination within the spatial distribution on the semiconductor wafer so that the effect of the parameter is counteracted.

While the invention has been described with reference to various embodiments, it will be understood that these embodiments are illustrative and that the scope of the invention is not limited to them. Many variations, modifications, additions and improvements of the embodiments described are possible. For example, the described method employs control of exposure to account for variations in processing parameters such as gate oxide thickness, polysilicon etch bias and rapid thermal annealing (RTA) temperature. The method is also applicable to control of exposure to account for variations in other processing parameters including variations in spacer etch, variations in temperature arising from other processing steps and processing devices and the like.

What is claimed is:

1. A method of controlling the spatial distribution of circuit performance across a semiconductor wafer during fabrication of an integrated circuit comprising:

determining a spatial distribution of polysilicon etch bias on the semiconductor wafer;

determining the effect of polysilicon etch bias on circuit performance; and exposing the semiconductor wafer to illumination in a photolithography operation, variably within the spatial distribution of polysilicon etch bias on the semiconductor wafer to counteract the effect of polysilicon bias variation.

2. A method in accordance with claim 1 wherein determining the effect of polysilicon etch bias on circuit performance includes:

measuring polysilicon etch bias using a SEM micrograph; and measuring drive current of devices according to spatial position on the semiconductor wafer; and correlating the measured polysilicon etch bias with the measured drive current.

3. A method in accordance with claim 1 further comprising:

determining a spatial distribution of gate oxide thickness on the semiconductor wafer;

determining the effect of gate oxide thickness on circuit performance; and exposing the semiconductor wafer to illumination, variably within the spatial distribution of the gate oxide thickness in combination with the distribution of polysilicon etch bias on the semiconductor wafer to counteract the effect of a combination of gate oxide thickness variation and polysilicon bias variation.

4. A method in accordance with claim 3 wherein determining the effect of the parameter on circuit performance includes:

measuring gate oxide thickness at a plurality of positions of the semiconductor wafer using a scanning electron microscope (SEM) micrograph;

measuring the drive current of a plurality of transistor devices obtained from a plurality of known positions of the semiconductor wafer; and correlating the measured drive current of the transistor devices with the measured gate oxide thickness at corresponding positions of the semiconductor wafer.

5. A method in accordance with claim 3 further comprising:

determining a spatial distribution of rapid thermal anneal (RTA) temperature on the semiconductor wafer;

determining the effect of RTA temperature on circuit performance; and exposing the semiconductor wafer to illumination, variably within the spatial distribution of the RTA temperature in combination with the distribution of polysilicon etch bias on the semiconductor wafer to counteract the effect of a combination of RTA temperature variation and polysilicon bias variation.

6. A method in accordance with claim 3 wherein determining the spatial distribution of gate oxide thickness includes an operation selected from the operations of:

measuring gate oxide thickness at a plurality of positions of the semiconductor wafer using an optical interference method;

measuring gate oxide thickness at a plurality of positions of the semiconductor wafer using ellipsometry;

measuring gate oxide thickness at a plurality of positions of the semiconductor wafer using a capacitance method; and measuring gate oxide thickness at a plurality of positions of the semiconductor wafer using an oxide film color chart.

7. A method in accordance with claim 1 wherein exposing the semiconductor wafer to illumination includes exposing the semiconductor wafer to X-ray illumination in an X-ray lithography system.

8. A method in accordance with claim 1 wherein exposing the semiconductor wafer to illumination includes exposing the semiconductor wafer to deep ultraviolet (UV) illumination in a photolithography system.

9. A method in accordance with claim 1 wherein exposing the semiconductor wafer to illumination includes exposing the semiconductor wafer to electron beam illumination.

10. A method in accordance with claim 1 wherein exposing the semiconductor wafer to illumination includes exposing the semiconductor wafer to ion-beam illumination.

11. A method in accordance with claim 1 further comprising:

determining a spatial distribution of rapid thermal anneal (RTA) temperature on the semiconductor wafer;

determining the effect of RTA temperature on circuit performance; and exposing the semiconductor wafer to illumination in a photolithography operation, variably within the spatial distribution of the RTA temperature in combination with the distribution of polysilicon etch bias on the semiconductor wafer to counteract the effect of a combination of RTA temperature variation and polysilicon bias variation.

12. A method of controlling the spatial distribution of circuit performance across a semiconductor wafer during fabrication of an integrated circuit comprising:

determining a spatial distribution of rapid thermal anneal (RTA) temperature on the semiconductor wafer;

determining the effect of RTA temperature on circuit performance; and exposing the semiconductor wafer to illumination, variably within the spatial distribution of RTA temperature on the semiconductor wafer to counteract the effect of RTA temperature variation.

13. A method in accordance with claim 12 wherein determining the effect of RTA temperature on circuit performance includes:

measuring RTA temperature across the spatial distribution of the semiconductor wafer using a thermocouple;

measuring drive current of devices according to spatial position on the semiconductor wafer; and correlating the measured RTA temperature with the measured drive current.

14. A method in accordance with claim 12 further comprising:

determining a spatial distribution of gate oxide thickness on the semiconductor wafer;

determining the effect of gate oxide thickness on circuit performance; and exposing the semiconductor wafer to illumination, variably within the spatial distribution of the gate oxide thickness in combination with the distribution of RTA temperature on the semiconductor wafer to counteract the effect of a combination of gate oxide thickness variation and RTA temperature variation.

15. A method in accordance with claim 14 wherein determining the effect of the parameter on circuit performance includes:

measuring gate oxide thickness at a plurality of positions of the semiconductor wafer using a scanning electron microscope (SEM) micrograph;

measuring the drive current of a plurality of transistor devices obtained from a plurality of known positions of the semiconductor wafer; and correlating the measured drive current of the transistor devices with the measured gate oxide thickness at corresponding positions of the semiconductor wafer.

16. A method in accordance with claim 14 wherein determining the spatial distribution of gate oxide thickness includes an operation selected from the operations of:

measuring gate oxide thickness at a plurality of positions of the semiconductor wafer using an optical interference method;

measuring gate oxide thickness at a plurality of positions of the semiconductor wafer using ellipsometry;

measuring gate oxide thickness at a plurality of positions of the semiconductor wafer using a capacitance method; and measuring gate oxide thickness at a plurality of positions of the semiconductor wafer using an oxide film color chart.

17. A method in accordance with claim 12 wherein exposing the semiconductor wafer to illumination includes exposing the semiconductor wafer to X-ray illumination in an X-ray lithography system.

18. A method in accordance with claim 12 wherein exposing the semiconductor wafer to illumination includes exposing the semiconductor wafer to deep ultraviolet (UV) illumination in a photolithography system.

19. A method in accordance with claim 12 wherein exposing the semiconductor wafer to illumination includes exposing the semiconductor wafer to electron beam illumination.

20. A method in accordance with claim 12 wherein exposing the semiconductor wafer to illumination includes exposing the semiconductor wafer to ion-beam illumination.

* * * * *

UNITED STATES PATENT AND TRADEMARK OFFICE
CERTIFICATE OF CORRECTION

PATENT NO.    : 5,943,550
ISSUE DATE    : 08/24/1999
INVENTOR(S)   : Fulford, H. Jim, Jr.; Wristers, Derick It is certified that error appears in the above-identified patent and that said Letters Patent is hereby corrected as shown below:

Column 1, line 68; please delete "polyetch" and insert --polysilicon etch--;
Column 6, line 39; please delete "perdendicular" and insert --perpendicular--;
Column 6, line 43; please delete "contants" and insert --constants; *and*
Column 6, line 46; please delete "contstants" and insert --constants--.

Signed and Sealed this

Twenty-seventh Day of March, 2001

*Attest:*

NICHOLAS P. GODICI

*Attesting Officer*   *Acting Director of the United States Patent and Trademark Office*